United States Patent [19]
Saito et al.

[11] Patent Number: 5,427,054
[45] Date of Patent: Jun. 27, 1995

[54] METHOD OF MAKING A DIAMOND FILM

[75] Inventors: Kimitsugu Saito; Koichi Miyata, both of Kobe, Japan

[73] Assignee: Kabushiki Kaisha Kobe Seiko Sho, Kobe, Japan

[21] Appl. No.: 254,762

[22] Filed: Jun. 6, 1994

[30] Foreign Application Priority Data

Jun. 10, 1993 [JP] Japan ................. 5-138143

[51] Int. Cl.$^6$ ............................................. C30B 29/04
[52] U.S. Cl. ........................................ 117/88; 423/446; 423/447.3
[58] Field of Search ............... 117/88; 423/446, 447.3

[56] References Cited

U.S. PATENT DOCUMENTS

| | | | |
|---|---|---|---|
| 5,225,275 | 7/1993 | Aida | 423/446 |
| 5,236,545 | 8/1993 | Pryor | 156/613 |
| 5,250,149 | 10/1993 | Kimoto et al. | 156/612 |
| 5,275,798 | 1/1994 | Aida | 423/446 |

*Primary Examiner*—R. Bruce Breneman
*Assistant Examiner*—Ramamohan Rao Paladugu
*Attorney, Agent, or Firm*—Oblon, Spivak, McClelland, Maier & Neustadt

[57] ABSTRACT

A process of forming high quality diamond films, wherein non-diamond components and crystal defects are significantly reduced. Diamond films are formed on a diamond substrate by vapor-phase synthesis using a source gas, wherein the atomic concentrations of oxygen and carbon, [O] and [C], respectively, in the source gas satisfy the condition that $0.01 \leq [C]/([C]+[O]) \leq 0.40$. Boron (B) doped p-type semiconducting films can also be formed using the same source gas which further includes a B-containing compound.

4 Claims, 4 Drawing Sheets

METHOD OF MAKING A DIAMOND FILM

BACKGROUND OF THE INVENTION

1. Field of the Invention

The present invention relates to a process for forming high quality diamond films on single crystal diamonds, polycrystalline diamond films and diamond particles by vapor-phase synthesis, which are used for semiconductors and optical devices.

2. Description of the Related Art

Diamond has high hardness, high thermal conductivity, and an excellent stability against heat, radiation and chemicals. In recent years, it becomes possible to form by vapor-phase synthesis using a chemical vapor deposition apparatus. The diamond film thus formed are used as coatings for cutting tools, speaker diaphragms, heat sinks for integrated circuits (ICs) and the like. Diamond is an electrically insulating material but becomes a p-type semiconducting material when doped with boron (B). Semiconducting diamond has a large band gap of about 5.4 eV, and withstands a high temperature of several hundred ° C. Research activities have been conducted to develop electronic devices such as diodes, transistors and sensors employing p-type semiconducting diamond films.

Generally, insulating diamond films are formed by vapor-phase synthesis using a source gas containing C, H or O, such as $CH_4$—$H_2$—$O_2$, $CH_4$—$H_2$—$CO_2$, $CH_3OH$—$H_2$, and $CO$—$H_2$ mixed gases. Such mixed gases are decomposed by microwave, heat or high frequency electromagnetic energies to deposit a diamond film on a substrate.

B-doped p-type semiconducting diamond films are formed by vapor-phase synthesis by adding $B_2H_6$ gas, or a boron-containing compound gas produced by dissolving solid $B_2O_3$ in acetone and bubbling it. Alternatively, B-doped p-type semiconducting diamond films may be formed by disposing solid boron (B) or solid $B_2O_3$ on or near a substrate during vapor-phase synthesis.

FIG. 1 shows a relationship between the size of diamond particles deposited in the initial stage of vapor-phase synthesis and the deposition time when diamond films are deposited on a substrate made of non-diamond material such as Si or Mo. In FIG. 1, step A is a nucleation stage on the substrate, showing that a certain period of time is necessary for the nucleation. In step B, the nuclei grow to be diamond particles, and the particle size become larger with time. As the synthesis is further continued, the diamond particles are connected to each other to form a continuous diamond film.

In general, when diamond is deposited by vapor-phase synthesis, graphite and amorphous carbon are simultaneously deposited, causing crystal defects in diamond. It is well known that non-diamond components are selectively etched by hydrogen in the source gas. The selective etching effect is more effective by the addition of oxygen, leading to a lower density of crystal defects and better crystallinity of diamond.

FIG. 2 shows a mixing condition of the atomic concentrations of carbon [C], hydrogen [H] and oxygen [O] in the source gas when diamond is deposited on non-diamond substrates. In this figure, region A shows the mixing condition of [C], [H] and [O] in the source gas when non-diamond components are mainly deposited; region B shows the mixing condition of [C], [H] and [O] in the source gas when diamond is mainly deposited; and region C shows the mixing condition of [C], [H] and [O] in the source gas when diamond is rarely grown. The conditions under which diamond is deposited by vapor-phase synthesis do not depend on the decomposition method of the source gas, but are when carbon atom concentration [C], hydrogen atom concentration [H] and oxygen atom concentration [O] in the source gas are present in the range shown by region B of FIG. 2 (P. K. Bachmann, D. Leers and H. Lydtin, Diamond and Related Materials, Vol. 1, p. 1, 1991; hereinafter, referred to as the prior art 1). When diamond is deposited under the mixing condition of the source gas in region B near the boundary with region A, wherein [H] and [O] are smaller with respect to [C], non-diamond components remain in diamond because of the shortage of hydrogen and oxygen. Under the condition of the region A, as described above, non-diamond components are mainly deposited.

When diamond is deposited under the condition of region B near the boundary with region C, wherein [H] and [O] are greater with respect to [C], non-diamond components are reduced to produce diamond with better quality; especially, when [O] is further increased, the quality of diamond is significantly improved. However, oxygen also etches diamond, therefore, as the mixing condition of the source gas comes close to region C, the nucleation density is reduced. In region C, diamond is rarely grown, because the etching rate of diamond by oxygen becomes higher than the growth rate. The boundary between regions B and C is expressed by $[C]/([C]+[O])=0.44$.

Unexamined Japanese Patent Publication No. HEI 1-301586 (hereinafter, referred to as the prior art 2) discloses that diamond is deposited on silicon substrates in both region B and part of region C of FIG. 2, when the source gas contains only hydrocarbon and oxygen but not hydrogen. However, the prior art 2 does not disclose mixing conditions to form high quality diamond films on diamond substrates.

In order to deposit high quality diamond films by vapor-phase synthesis, single crystal diamond or polycrystalline diamond films must be used for substrates. Moreover, as a mixing condition for the source gas, [O] is required to be increased with respect to [C]. However, when diamond is deposited under the condition of $[C]/([C]+[O]) \geq 0.44$, large amounts of non-diamond components and crystal defects remain in diamond crystals. As a result, the diamond films thus obtained do not meet the quality requirements for active layers and insulating layers of semiconducting diamond devices.

SUMMARY OF THE INVENTION

An object of the present invention is to provide a process for forming high quality diamond films wherein non-diamond components and crystal defects are significantly reduced, which are suitable for electronic devices.

To achieve the above object, according to the present invention, there is provided a process for forming a diamond film on a diamond substrate by vapor-phase synthesis using a source gas, wherein the atomic concentrations of oxygen and carbon [O] and [C] in said source gas satisfy a relationship of $0.01 \leq [C]/([C]+[O]) \leq 0.40$. In this process, a B doped p-type semiconducting film is formed using said source gas added with a B-containing compound.

DETAILED DESCRIPTION OF THE PREFERRED EMBODIMENTS

Prior to the description of preferred embodiments of the present invention, the mechanism of diamond deposition according to the present invention is described.

Figure 1:
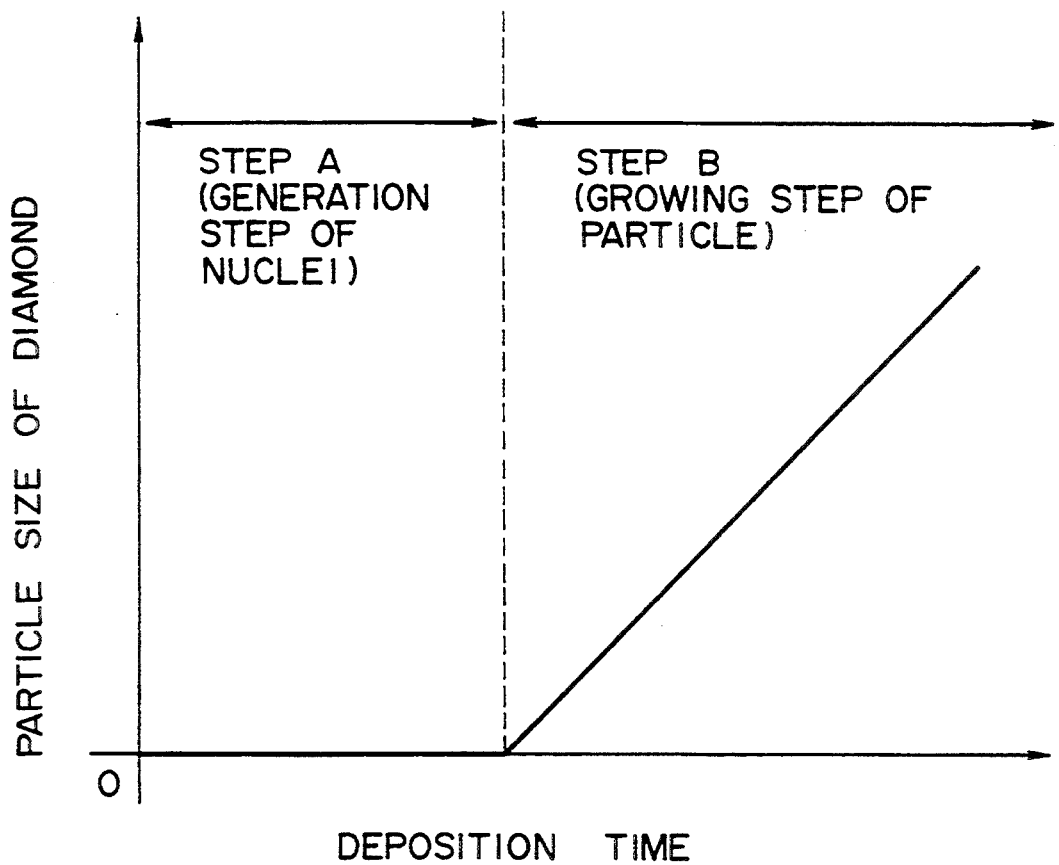
FIG. 1 is a graph showing a relationship between the particle size of diamond particles deposited on a non-diamond substrate and the deposition time.
Figure 2:
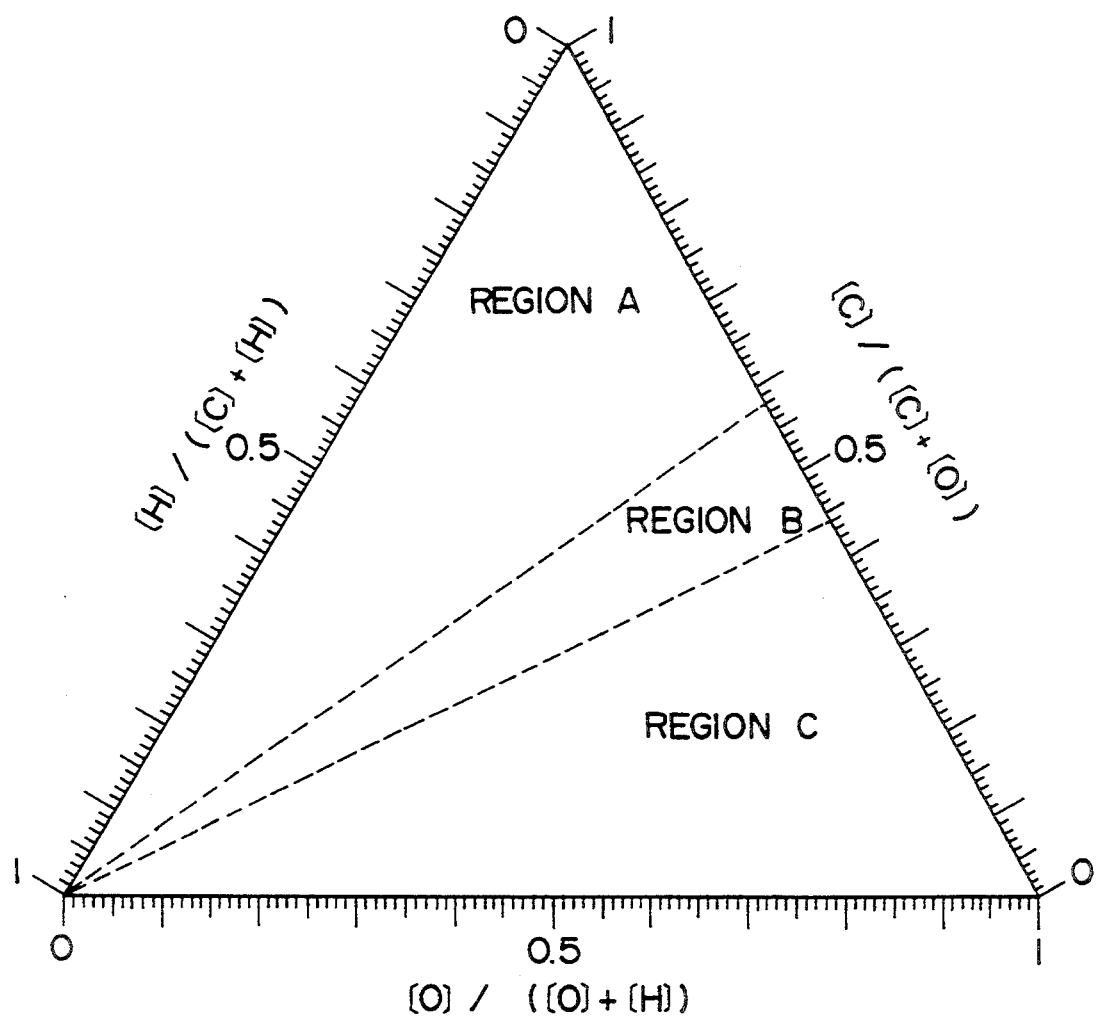
FIG. 2 is a graph showing the mixing condition of [C], [H] and [O] in a source gas when diamond is formed on non-diamond substrates.

In the present invention, high quality diamond films can be obtained, wherein non-diamond components and crystal defects are significantly reduced. Specifically, in the present invention, diamond films are formed on diamond substrates. Such a process eliminates step A in FIG. 1 for generating nuclei of diamond, which is necessary in the case of using substrates made of non-diamond materials. In other words, the condition, $[C]/([C]+[O]) \geq 0.44$ is not required to form diamond nuclei. As a result, even in the region where diamond nuclei are not generated on non-diamond substrates, that is, under the condition of $[C]/([C]+[O]) < 0.44$, diamond can be deposited when diamond substrates are used. In this case, [O] can be higher than the case when non-diamond materials are used for the substrates, so that non-diamond components and crystal defects can be effectively removed. As will be apparent from examples described above, when [O] satisfies the relation, $[C]/([C]+[O]) \leq 0.44$, it is possible to improve the crystallinity of diamond, and hence to obtain high quality diamond suitable for semiconducting devices.

The above-described substrates include natural single crystal diamond, single crystal diamond formed by high pressure synthesis, and diamond films formed by vapor-phase synthesis.

Although the ratio of $[C]/([C]+[O])$ is desirable to be smaller, the etching effect by oxygen is significantly increased as [O] increases. When the ratio of $[C]/([C]+[O])$ is less than 0.01, the etching rate by oxygen becomes higher than the deposition rate of diamond, and as a result, diamond is no longer deposited. Therefore, [C] and [O] must satisfy a relationship, $[C]/([C]+[O]) \geq 0.01$.

The present invention becomes more apparent by way of examples with reference to the accompanying drawings.

EXAMPLE 1

Using various mixed gases as source gases, diamond films were formed by microwave CVD on the (100) face of a type Ib single crystal diamonds made by high pressure synthesis. The diamond films were deposited to a thickness of 5 $\mu$m at a substrate temperature of 800° C. and under a gas pressure of 35 Torr. Table 1 shows the composition of the source gas and the ratio of $[C]/([C]+[O])$ for each sample.

TABLE 1

| Sample No. | Source Gas | | $\frac{[C]}{[C]+[O]}$ | FWHM of Raman Peak (cm$^{-1}$) |
|---|---|---|---|---|
| 1 | CH$_4$ | 6.0% | 0.4 | 2.0 |
|   | O$_2$ | 4.5% | | |
|   | H$_2$ | 89.5% | | |
| 2 | CO | 7.2% | 0.4 | 1.8 |
|   | O$_2$ | 1.8% | | |
|   | H$_2$ | 91.0% | | |
| 3 | CO$_2$ | 75% | 0.4 | 2.2 |
|   | CH$_4$ | 25% | | |
| 4 | CO | 50% | 0.4 | 2.6 |
|   | CO$_2$ | 50% | | |

In Table 1, [C] and [O] in all cases were adjusted to satisfy the relationship of $([C]+[O]) \leq 0.4$. The crystallinity of each sample was evaluated by Raman spectroscopy. In the Raman spectrum, a peak of diamond appeared near 1332 cm$^{-1}$. The Full-Width at Half-Maximum (FWHM) of the peak become smaller as the crystallinity of diamond becomes better. The FWHM of the Raman peak at 1332 cm$^{-1}$ obtained for each sample is also shown in Table 1.

As a first comparative example, diamond films were formed by vapor-phase synthesis under a condition of $[C]/([C]+[O]) > 0.4$. The diamond films thus obtained were characterized by the FWHM of the Raman peak, and the results are shown in Table 2.

TABLE 2

| Sample No. | Source Gas | | $\frac{[C]}{[C]+[O]}$ | FWHM of Raman Peak (cm$^{-1}$) |
|---|---|---|---|---|
| 5 | CH$_4$ | 6.0% | 0.45 | 3.4 |
|   | O$_2$ | 3.6% | | |
|   | H$_2$ | 90.4% | | |
| 6 | CO | 7.2% | 0.45 | 3.0 |
|   | O$_2$ | 0.8% | | |
|   | H$_2$ | 92.0% | | |
| 7 | CO$_2$ | 61.1% | 0.45 | 3.8 |
|   | CH$_4$ | 38.9% | | |
| 8 | CO | 77.7% | 0.45 | 4.2 |
|   | CO$_2$ | 22.3% | | |

By comparison between the results of Tables 1 and 2, the FWHM of the Raman peak become unfavorably larger when [C] and [O] in the source gas satisfy the relationship of $[C]/([C]+[O]) > 0.40$. On the contrary, the FWHM becomes smaller when [C] and [O] satisfy the relationship of $[C]/([C]+[O]) \leq 0.4$, indicating that the crystallinity of the diamond film was better.

EXAMPLE 2

Diamond films were first formed by vapor-phase synthesis on the (111) face of a single crystal silicon according to the prior art 1 using a CH$_4$—H$_2$—O$_2$ gas (concentration of CH$_4$: 0.5%, concentration of O$_2$: 0.1%). On the diamond films thus obtained, diamond films were newly deposited by microwave plasma chemical vapor deposition (CVD) using source gases with various compositions. The diamond films were deposited to a thickness of 5 $\mu$m at a substrate temperature of 800° C. and under a gas pressure of 35 Torr. Table 3 shows the composition of the source gas and the ratio of $[C]/([C]+[O])$ for each sample.

TABLE 3

| Sample No. | Source Gas | | $\frac{[C]}{[C]+[O]}$ | FWHM of Raman Peak $(cm^{-1})$ |
|---|---|---|---|---|
| 1 | $CH_4$ | 0.5% | 0.4 | 4.0 |
|   | $O_2$ | 0.38% | | |
|   | $H_2$ | 99.12% | | |
| 2 | CO | 7.2% | 0.4 | 3.8 |
|   | $O_2$ | 1.8% | | |
|   | $H_2$ | 91.0% | | |
| 3 | $CO_2$ | 75% | 0.4 | 4.2 |
|   | $CH_4$ | 25% | | |
| 4 | CO | 50% | 0.4 | 4.6 |
|   | $CO_2$ | 50% | | |

In Table 3, [C] and [O] satisfy the relationship, $([C]+[O]) \leq 0.4$. The crystallinity of the sample was evaluated by Raman spectroscopy. The FWHM of the Raman peak of diamond at 1332 $cm^{-1}$ for each sample is also shown in Table 3.

As a second comparative example, diamond films were formed by vapor-phase synthesis under the condition of $[C]/([C]+[O]) > 0.4$. The observed results of the FWHM for the diamond films are shown in Table 4.

TABLE 4

| Sample No. | Source Gas | | $\frac{[C]}{[C]+[O]}$ | FWHM of Raman Peak $(cm^{-1})$ |
|---|---|---|---|---|
| 5 | $CH_4$ | 0.5% | 0.45 | 6.2 |
|   | $O_2$ | 0.3% | | |
|   | $H_2$ | 99.2% | | |
| 6 | CO | 7.2% | 0.45 | 5.6 |
|   | $O_2$ | 0.8% | | |
|   | $H_2$ | 92.0% | | |
| 7 | $CO_2$ | 61.1% | 0.45 | 6.6 |
|   | $CH_4$ | 38.9% | | |
| 8 | CO | 77.7% | 0.45 | 7.0 |
|   | $CO_2$ | 22.3% | | |

In the comparison between the results of Tables 3 and 4, the FWHM becomes smaller when [C] and [O] satisfy the relationship of $[C]/([C]+[O]) < 0.4$, indicating that the crystallinity was improved.

EXAMPLE 3

Figure 3:
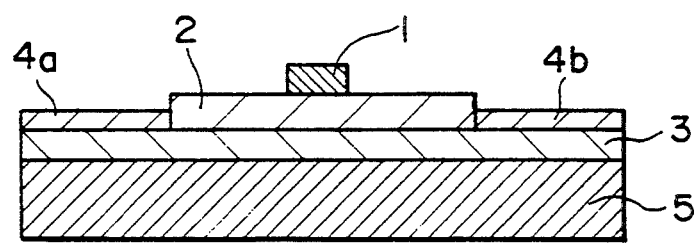
FIG. 3 is a sectional view showing a structure of diamond Field Effect Transistor (FET)

A diamond field effect transistor (hereinafter, referred to as a diamond FET) with a structure shown in FIG. 3 was fabricated on a (100) face of a type Ib single crystal diamond grown by high pressure synthesis. In the diamond FET shown in FIG. 3, a p-type semiconducting diamond layer 3 was formed on the single crystal diamond substrate 5. An insulating diamond layer 2 was formed on the p-type semiconducting diamond layer 3, and further, a source ohmic contact 4a and a drain ohmic contact 4b were formed on both sides of the insulating diamond layer 2. Finally, a gate electrode 1 was formed on the insulating diamond layer 2.

In this example, both the p-type semiconducting diamond layer 3 and the insulating diamond layer 2 were deposited by microwave plasma CVD to a thickness of 0.5 μm at a substrate temperature of 800° C. and under a gas pressure of 35 Torr. As the source gases, a $CH_4$—$H_2$—$O_2$ gas (concentration of $CH_4$: 6.0%, concentration of $O_2$: 4.5%) was used for the insulating diamond layer 2; and a $CH_4$—$H_2$—$O_2$—$B_2H_6$ gas (concentration of $CH_4$: 6.0%, concentration of $O_2$: 4.5%, concentration of $B_2H_6$: 5 ppm) was used for the p-type semiconducting diamond layer 3. In each case, [C] and [O] in the source gas satisfy the relation of $[C]/([C]+[O])=0.4$ which is within the range specified in the present invention. The gate electrode 1 was made of aluminum, and the source electrode 4a and the drain electrode 4b were made of tungsten.

Figure 4:
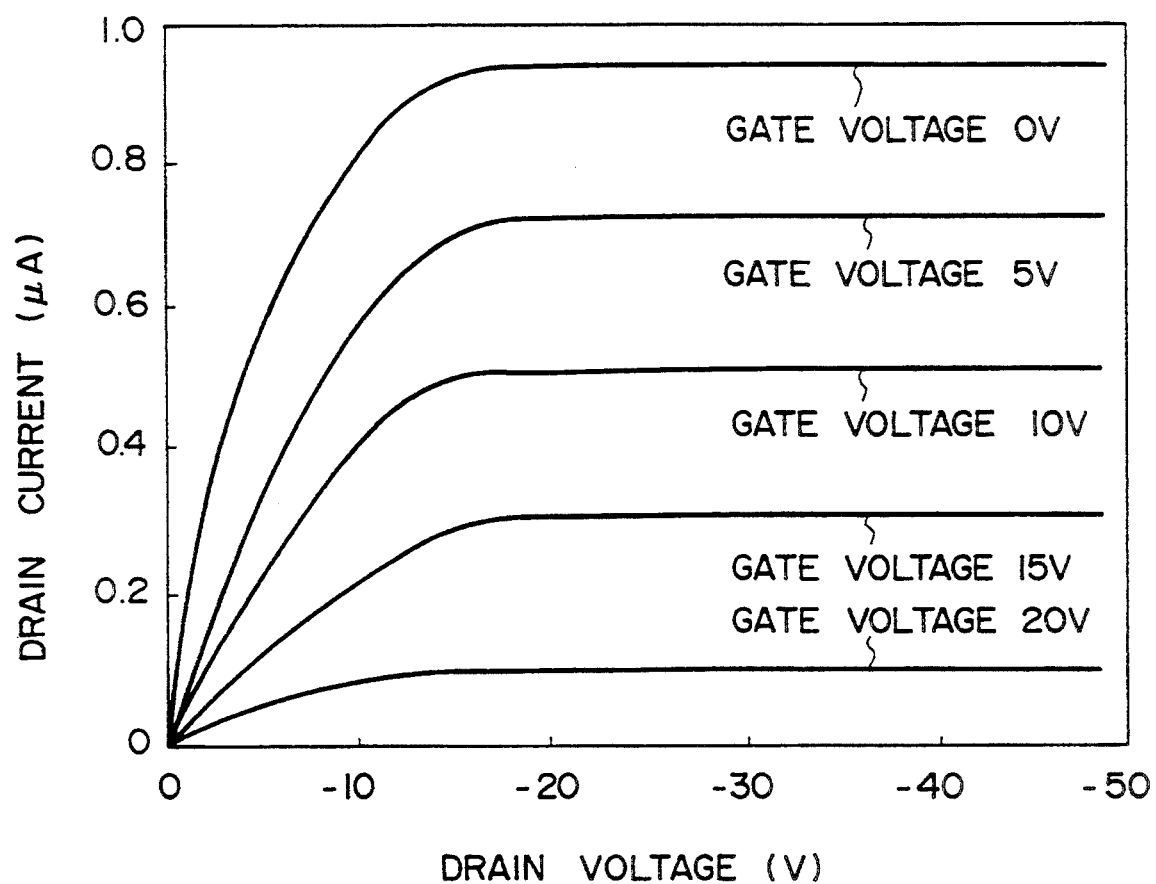
FIG. 4 is a graph showing current-voltage characteristics between source and drain of diamond FET according to the third inventive example.
Figure 5:
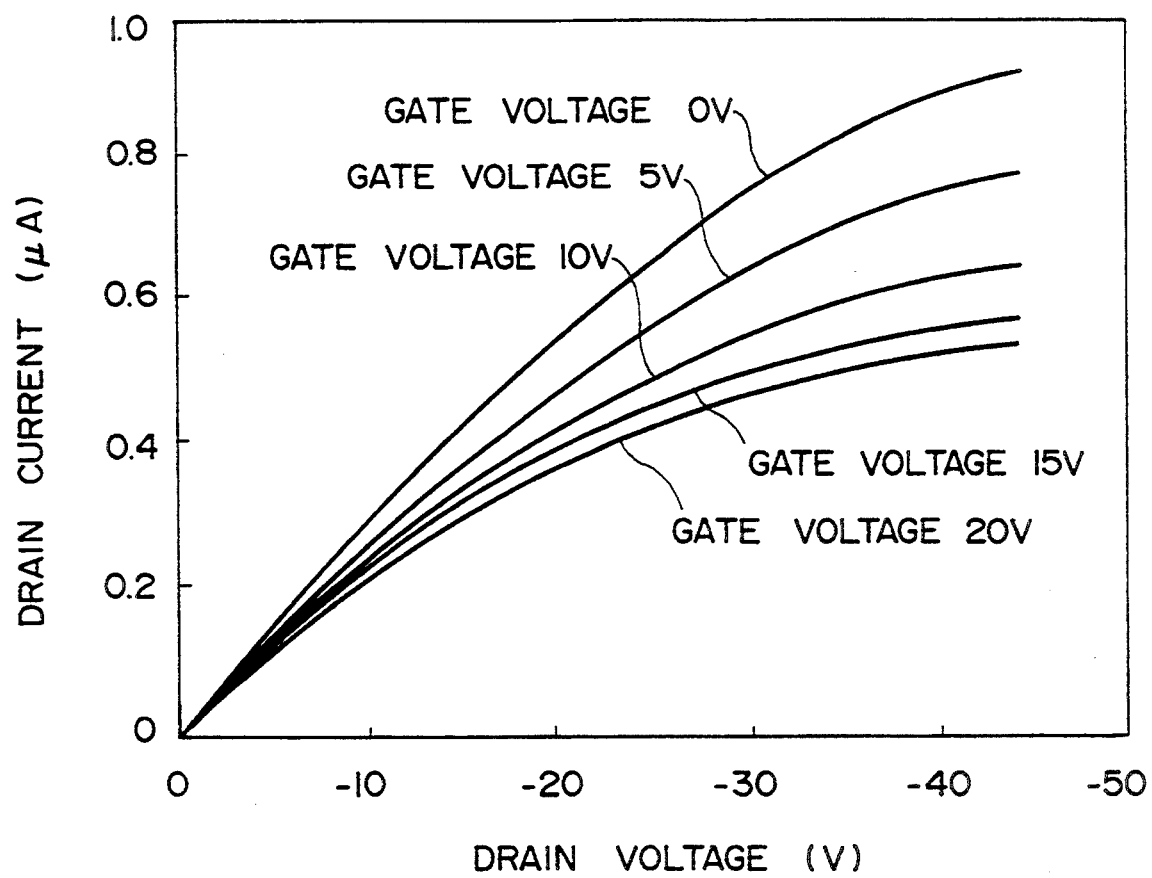
FIG. 5 is a graph showing current-voltage characteristics between source and drain of diamond FET according to the third comparative example.

FIG. 4 shows current-voltage characteristics between source and drain when a positive voltage applied to the gate electrode 1 was varied. As a third comparative example, a diamond FET was fabricated under the condition that the concentration of $O_2$ was 3.6% ($[C]/([C]+[O])=0.45$, which is out of the range of the present invention) when an insulating diamond layer 2 and a p-type semiconducting diamond layer 3 were formed. FIG. 5 shows current-voltage characteristics between source and drain of the diamond FET thus obtained. In the third comparative example 3 shown in FIG. 5, both the insulating diamond layer 2 and the p-type semiconducting diamond layer 3 do not have a good crystallinity, and thereby the modulation in the current-voltage characteristics was small. On the contrary, in the third inventive example shown in FIG. 4, the diamond layers 2 and 3 have a better crystallinity, so that the operation of the transistor was found to be excellent.

What is claimed is:

1. A process of forming a diamond film on a diamond substrate, comprising the step of forming a diamond film on a diamond substrate by vapor-phase synthesis, wherein said vapor-phase synthesis is conducted in the presence of a source gas having atomic concentrations of oxygen and carbon, [O] and [C], respectively, which satisfy the condition $0.01 \leq [C]/([C]+[O]) \leq 0.40$.

2. A process for forming a diamond film according to claim 1, wherein a boron (B) doped p-type semiconducting film is formed using said source gas which further includes a B-containing compound.

3. A process as claimed in claim 1, wherein said vapor-phase synthesis is conducted in a source gas consisting of compounds whose elements are selected from the group consisting of carbon, hydrogen and oxygen.

4. A process as claimed in claim 1, wherein said vapor-phase synthesis is conducted in a source gas consisting of compounds whose elements are selected from the group consisting of carbon, boron, hydrogen and oxygen.

* * * * *